(12) United States Patent
Murakami et al.

(10) Patent No.: US 6,919,106 B2
(45) Date of Patent: Jul. 19, 2005

(54) METHOD FOR PREPARING POROUS SOG FILM

(75) Inventors: Hirohiko Murakami, Ibaraki (JP); Chiaki Tanaka, Ibaraki (JP); Masaaki Hirakawa, Ibaraki (JP)

(73) Assignee: Ulvac Inc., Chigasaki (JP)

( * ) Notice: Subject to any disclaimer, the term of this patent is extended or adjusted under 35 U.S.C. 154(b) by 246 days.

(21) Appl. No.: 09/926,671

(22) PCT Filed: Apr. 3, 2001

(86) PCT No.: PCT/JP01/02885

§ 371 (c)(1),
(2), (4) Date: Nov. 30, 2001

(87) PCT Pub. No.: WO01/75957

PCT Pub. Date: Oct. 11, 2001

(65) Prior Publication Data

US 2003/0087042 A1 May 8, 2003

(30) Foreign Application Priority Data

| Apr. 3, 2000 | (JP) | 2000-101478 |
| Nov. 24, 2000 | (JP) | 2000-357808 |
| Feb. 21, 2001 | (JP) | 2001-045276 |
| Feb. 22, 2001 | (JP) | 2001-046727 |
| Feb. 22, 2001 | (JP) | 2001-046728 |
| Feb. 22, 2001 | (JP) | 2001-046797 |

(51) Int. Cl.$^7$ ................................. H05H 1/00
(52) U.S. Cl. ............... 427/535; 427/551; 427/558; 427/243; 427/245; 427/379; 427/387; 427/397.7; 427/419.2; 427/419.7
(58) Field of Search .......................... 427/243, 245, 427/379, 397.7, 387, 419.2, 419.7, 551, 558, 535

(56) References Cited

U.S. PATENT DOCUMENTS 5,762,697 A * 6/1998 Sakamoto et al. ..... 106/287.16
6,204,202 B1 * 3/2001 Leung et al. ............ 438/781
6,268,457 B1 * 7/2001 Kennedy et al. .......... 528/39
6,368,400 B1 * 4/2002 Baldwin et al. .......... 106/481
6,506,497 B1 * 1/2003 Kennedy et al. .......... 428/447
6,586,104 B2 * 7/2003 Matsuda et al. .......... 428/447

FOREIGN PATENT DOCUMENTS

| JP | 4-280812 | 10/1992 |
| JP | 9-213797 | 8/1997 |
| JP | 9-227113 | 9/1997 |
| JP | 9-227249 | 9/1997 |
| JP | 11-284189 | 10/1999 |
| JP | 2000-58540 | 2/2000 |

OTHER PUBLICATIONS

International Search Report dated Jul. 3, 2001.

* cited by examiner

Primary Examiner—Kirsten Jolley
(74) Attorney, Agent, or Firm—Westerman, Hattori, Daniels & Adrian, LLP (57) ABSTRACT

A porous SOG film is formed by preparing an organic silane solution containing an organic silane, water and an alcohol, subjecting the organic silane to acid hydrolysis or alkali hydrolysis and then heat-treating the resulting reaction system in the presence of a surfactant to thus form a porous $SiO_2$ film to use for an interlayer insulating film. Alternatively, a porous SOG film is formed by repeating the foregoing step at least one time; or by forming a hydrophobic film on the porous $SiO_2$ film prepared by the foregoing step by the CVD or sputtering technique to thus cap the surface of the porous film; or repeating the porous film-forming and capping steps at least one time. Moreover, after the preparation of the foregoing porous $SiO_2$ film, it is subjected to either of the oxygen plasma-treatment, electron beam-irradiation treatment and UV light-irradiation treatment to remove the unreacted OH groups remaining on the porous film and to thus form a porous SOG film. Further, the foregoing heat-treatment is carried out in the following two stages: in the first stage, the porous film is treated at a temperature capable of mainly removing the water and the alcohol through evaporation thereof; and in the second stage, the porous $SiO_2$ film is treated at a temperature (350 to 450° C.) sufficient for covering at least the inner walls of the holes with the hydrophobic moieties of the surfactant.

15 Claims, 3 Drawing Sheets

METHOD FOR PREPARING POROUS SOG FILM

TECHNICAL FIELD

The present invention relates to a method for preparing a porous SOG film and in particular to a method for preparing a porous SOG film, which comprises the steps of subjecting an organic silane to hydrolysis and then heat-treating the hydrolyzed organic silane in the presence of a surfactant.

BACKGROUND ART

Recently, distributing wires or interconnections of, for instance, copper (Cu) or aluminum (Al) have been adopted in the field of LSI and simultaneously, there have widely been conducted researches in and development of the interconnection structure and interlayer insulating films. However, it is difficult to effectively reduce the interconnecting delay by simply using the interconnection of, for instance, Cu. For this reason, in the semiconductor device-fabricating process, an oxide film (such as a $SiO_2$ film) having a low relative dielectric constant is used as an interlayer insulating film and there has been proposed such an idea that the oxide film is converted into or replaced with a porous oxide film from the viewpoint of further reduction of the relative dielectric constant of such an oxide film. For instance, there has been proposed a technique for forming a porous $SiO_2$ film having a lower relative dielectric constant through the silylation of an inorganic SOG (spin on glass), while making use of the conventional SOG coating technique. In addition, it has also been proposed to form a $SiO_2$ film having a low relative dielectric constant by the plasma polymerization of an organic silane according to the plasma CVD technique.

If a $SiO_2$ film is formed according to the conventional technique and then a film is further deposited on the $SiO_2$ film in the semiconductor device-fabricating process such as the CVD process, a problem arises, such that the relative dielectric constant of the resulting product increases. In the case of the porous $SiO_2$ film formed using an inorganic SOG, a problem arises such that the diameter of the holes present in the resulting porous film is too large to reduce the relative dielectric constant thereof by the formation of fine pores. In addition, in the case of the $SiO_2$ film formed using an organic silane, problems arise such that the resulting film is insufficient in the film quality and that the heat-resistant temperature thereof is low (not more than 450° C.).

Therefore, the first object of the present invention is to eliminate the foregoing drawbacks associated with the conventional techniques and more specifically to provide a method for preparing a porous SOG film or an interlayer insulating film (or interlayer dielectric) having a low relative dielectric constant, whose dielectric constant is never changed even when a film is further deposited on the SOG film according to, for instance, the CVD process after the formation of this interlayer insulating film (first invention).

Moreover, it has been known that the porous film formed by the foregoing conventional method absorbs moisture since the film has hygroscopicity due to the porous characteristics thereof and this in turn leads to corrosion of interconnections of, for instance, Al. For this reason, there have been proposed methods of chemical treatments for making the inner surface of the holes in the film hydrophobic by replacing the hydrophilic OH groups remaining on the porous film with hydrophobic $CH_3$ groups or by subjecting the OH groups to dehydration to thus convert them into $SiO_2$, for the improvement of the hygroscopicity of the film.

Moreover, even in the method for preparing a porous SOG film (or an interlayer insulating film) having a low relative dielectric constant, whose dielectric constant never causes any change when depositing another film on the interlayer insulating film according to, for instance, the CVD process after the formation of the interlayer insulating film, the penetration of moisture such as water vapor through the surface of the resulting porous $SiO_2$ film often becomes a cause of a critical problem, since the holes present therein are arranged perpendicularly to the substrate. Further, the inorganic SOG film includes a large quantity of OH groups and therefore, unreacted OH groups may still remain in the film even after the firing of the same. Accordingly, a problem arises such that the moisture in the atmosphere is adsorbed on the film through the residual OH groups and this results in the corrosion of the Al interconnections. Moreover, the foregoing chemical processing suffers from a problem of the difficulty in the control of the process.

Accordingly, it is the second object of the present invention to solve the foregoing problems of the moisture (such as water vapor)-penetration through the film surface and the hygroscopicity thereof and more specifically to provide a method for preparing a multi-layered porous SOG film or a mono-layered porous SOG film or an interlayer insulating film having a low relative dielectric constant, which can inhibit any moisture-penetration through the film surface and reduce the hygroscopicity of the film and whose dielectric constant never cause any change even when an additional film is deposited on the insulating layer according to, for instance, the CVD process after the formation of the insulating film (second invention).

It is the third object of the present invention to solve the foregoing problem caused by the presence of unreacted OH groups in a porous SOG film by the removal of the OH groups from the porous film and more specifically to provide a method for preparing a porous SOG film or an interlayer insulating film having a low relative dielectric constant, which is not changed at all even when an additional film is deposited on the insulating layer according to, for instance, the CVD process after the formation of the insulating film (third invention).

Moreover, it is the fourth object of the present invention to solve the foregoing problem caused by the presence of unreacted OH groups in a porous SOG film and more specifically to provide a method for preparing a porous SOG film or a porous interlayer insulating film, which does not have any OH group at least on the inner wall of the holes and thus has a low relative dielectric constant, whose dielectric constant is never changed even when an additional film is deposited on the insulating layer according to, for instance, the CVD process after the formation of the insulating film, the method being characterized in that the process control thereof is very easy (fourth invention).

DISCLOSURE OF THE INVENTION

The inventors of the present invention have selected a variety of materials for the interlayer insulating film and have conducted various investigations to find out suitable materials and suitable reaction conditions in order to prepare a porous $SiO_2$ film having a low relative dielectric constant according to the spin coating technique from such a standpoint that the relative dielectric constant of the interlayer insulating film is preferably as low as possible. As a result, the inventors have succeeded in the preparation of a porous $SiO_2$ film having a low relative dielectric constant if a surfactant is added to the reaction system, which makes use of an organic silane, and have found that the resulting porous film never causes any change in the relative dielectric constant even when an additional film is further deposited on the porous film in the semiconductor device-fabricating process subsequent to the formation of the porous film. Thus, the inventors have accomplished the first object of the present invention.

The method for preparing a porous SOG film according to the first invention comprises the steps of preparing an organic silane solution containing an organic silane, water and an alcohol, subjecting the organic silane to acid hydrolysis or alkali hydrolysis and then heat-treating the resulting reaction system in the presence of a surfactant to thus form a porous $SiO_2$ film.

Moreover, the inventors of the present invention have also conducted various studies to inhibit any penetration of moisture such as water vapor through the surface of the porous $SiO_2$ film prepared by the foregoing method and to control or reduce the hygroscopicity of the porous film. As a result, the inventors of this invention have succeeded in the preparation of a porous $SiO_2$ film having a low relative dielectric constant or an interlayer insulating film consisting of a hydrophobic porous $SiO_2$ film by forming a porous $SiO_2$ film while adding a surfactant to the reaction system containing an organic silane, and then repeating this step at least one time to further form a porous $SiO_2$ film on the porous film formed in the previous step and to thus give a multi-layered $SiO_2$ film; or inserting a specific hydrophobic film between every neighboring two porous films; or capping or coating the surface of the porous film with a specific hydrophobic film, and have found that the resulting porous film or the interlayer insulating film never causes any change in the relative dielectric constant even when an additional film or films are further deposited on the porous film in the semiconductor device-fabricating process subsequent to the formation of the porous film. Thus, the inventors have accomplished the second object of the present invention.

The method for preparing a porous SOG film according to the second invention comprises the step of repeating, at least one time, the foregoing first step for preparing a porous $SiO_2$ film to thus form in order a porous $SiO_2$ film on the porous film formed in the first step. If a number of porous films are laminated in this way to give a multi-layered porous film, the hygroscopicity of the resulting porous $SiO_2$ film is reduced and the relative dielectric constant thereof never causes any change even when a film is further deposited on or laminated with the porous film in the subsequent semiconductor device-fabricating process. As a result of such lamination, the porous films constituting the laminate are put in layers while the holes present in every neighboring porous films and arranged perpendicularly to the substrate deviate from one another and therefore, the holes present in the uppermost film have almost no communication with those present in the lowermost film or there is almost no through hole in the multi-layered film. The moisture absorption of the laminated porous film is thus controlled.

In the present invention, it is also possible to conduct the second step in which either of a $SiO_2$ film, a $SiN_x$ film and a $SiO_xN_y$ film is formed on the porous $SiO_2$ film prepared in the foregoing first step by the CVD or sputtering method to thus cap the surface of the porous film; or to further repeat the foregoing first and second steps at least one time. In both of the monolayered porous film capped with a hydrophobic film in this way and the multilayered porous film, the moisture penetration and the hygroscopicity thereof are further reduced and controlled as compared with the porous film free of any cap of a hydrophobic film and the relative dielectric constant thereof is never changed even when an additional film is deposited thereon in the subsequent semiconductor device-fabricating process.

Further, the inventors of the present invention have conducted various researches to remove the OH groups remaining in the porous $SiO_2$ film prepared by the foregoing method. As a result, the inventors have succeeded in the removal of the unreacted OH groups remaining in the porous film by forming a porous $SiO_2$ film, while adding a surfactant to the reaction system containing an organic silane and then subjecting the resulting porous $SiO_2$ film to either of the treatment with oxygen plasma, the electron beam-irradiation treatment and the UV light-irradiation treatment, to thus give a porous $SiO_2$ film having a low relative dielectric constant or a hydrophobic porous $SiO_2$ film whose dielectric constant never undergoes any change even when an additional film or films are deposited thereon in the semiconductor device-fabricating process after the formation of the porous film and have thus accomplished the third object of the present invention.

The method for preparing a porous SOG film according to the third invention comprises the steps of preparing an organic silane solution containing an organic silane, water and an alcohol, subjecting the organic silane to acid hydrolysis or alkaline hydrolysis, heat-treating the reaction system in the presence of a surfactant to give a porous $SiO_2$ film and then subjecting the resulting porous $SiO_2$ film to either of the treatment with oxygen plasma, the electron beam-irradiation treatment or the UV light-irradiation treatment, to thus remove the unreacted OH groups remaining in the porous $SiO_2$ film. The following reaction occurs due to the foregoing treatments and thus the OH groups are removed:

$$(OSiOH)_2O \rightarrow 2SiO_2 + H_2O$$

The residual OH groups are removed as $H_2O$ according to the foregoing reaction and the moisture in the atmosphere is thus never adsorbed on the porous film. Accordingly, the foregoing method can provide a porous film having a low relative dielectric constant and this in turn leads to the reduction of any corrosion of interconnections of, for instance, Al. In addition, this hydrophobic porous $SiO_2$ film never causes any change in the relative dielectric constant even when an additional film or films are deposited thereon or laminated with the same in the subsequent semiconductor device-fabricating process.

Moreover, the inventors of the present invention have conducted various investigations to obtain a porous $SiO_2$ film free of any residual unreacted OH groups. As a result, the inventors have succeeded in making the porous film hydrophobic by conducting the heat-treatment in two stages when preparing a porous $SiO_2$ film, while adding a surfactant to the reaction system obtained using an organic silane solution to thus give a hydrophobic porous $SiO_2$ film or a porous $SiO_2$ film having a low relative dielectric constant, which never undergoes any change in the dielectric constant even when an additional film or films are deposited thereon or laminated with the same in the semiconductor device-fabricating process after the formation of the porous film and thus have accomplished the fourth object of the present invention.

The method for preparing a porous SOG film according to the fourth invention comprises the steps of preparing an organic silane solution containing an organic silane, water and an alcohol, subjecting the organic silane to acid hydrolysis or alkaline hydrolysis and then subjecting the reaction system thus obtained to a heat-treatment in the presence of a surfactant, wherein the method is characterized in that the heat-treatment comprises the first heat-treating step carried out at a temperature sufficient for mainly evaporating the water and the alcohol present in the reaction system and the second heat-treating step carried out at a temperature sufficient for covering at least the inner walls of the holes present in the resulting porous $SiO_2$ film with the hydrophobic moieties (hereunder referred to as "hydrophobic group(s)") of the surfactant, the temperature used in the second step being higher than that used in the first step. Thus, the inner walls of the holes present in the porous film become hydrophobic and any moisture in the atmosphere is never adsorbed on the porous film. As a result, a porous film having a low relative dielectric constant is prepared and this in turn leads to the reduction of any corrosion of interconnections of, for instance, Al. In addition, this hydrophobic porous $SiO_2$ film does not cause any change in the dielectric constant even when an additional film or films are laminated with or deposited on the porous film in the subsequent semiconductor device-fabricating process. In order to cover the inner walls of the holes present in the porous film with the hydrophobic groups, it is preferred to mainly evaporate solvents such as water and alcohol and then fire the porous film at temperatures ranging from 350 to 450° C. This is because if the firing temperature is less than 350° C., it is difficult to obtain a porous film having a desired low relative dielectric constant, while if the temperature exceeds 450° C., the surfactant is excessively evaporated and therefore, the hydrophobic groups are removed from the resulting porous film and further the film structure may be destroyed.

Moreover, according to the first invention, the porous $SiO_2$ film can be prepared by admixing an organic silane, water, an alcohol and an acid or an alkali and further adding a surfactant to the resulting mixture to give an organic silane solution, applying the silane solution onto a semiconductor substrate by the spin coating technique, and then evaporating the water and the alcohol as well as the surfactant from the coated layer by a heat-treatment. According to the second invention, the porous $SiO_2$ film can be prepared by forming a $SiO_2$ film, a $SiN_x$ film or a $SiO_xN_y$ film on the surface of the porous $SiO_2$ film produced after the foregoing heat-treatment according to the CVD or sputtering technique to thus cap the surface of the porous film; or by further repeating the foregoing heat-treating step and the capping step at least one time to thus form a multilayered film. According to the third invention, the hydrophobic porous $SiO_2$ film can be prepared by subjecting the porous $SiO_2$ film obtained after the foregoing heat-treatment to either of the treatment with oxygen plasma, the electron beam-irradiation treatment and the UV light-irradiation treatment to thus remove the unreacted OH groups remaining in the porous $SiO_2$ film. According to the fourth invention, the hydrophobic porous $SiO_2$ film can be prepared by carrying out the foregoing heat-treatment in the following two stages: in the first stage, the porous film is obtained by treating at temperatures ranging from 200 to 350° C. to thus mainly remove the water and the alcohol and in the second stage, the porous film is treated at temperatures ranging from 350 to 450° C. to thus finish the formation of the porous film, while adhering the hydrophilic moieties (hereunder referred to as "hydrophilic group") of the surfactant to at least the film surface of the inner walls of the holes present in the resulting porous film and to thus cover the inner walls of the holes with the hydrophobic groups of the surfactant, i.e. the hydrophobic groups are directed outward. Thus, the surfactant is evaporated to a desired degree and at least the inner walls of the holes thus become hydrophobic.

The organic silanes used in the foregoing first to fourth inventions are hydrolyzable organic oxysilanes such as TEOS (tetraethoxysilane), and TMOS (tetramethoxy silane). The surfactants usable herein are preferably cationic surfactants, in particular, halogenated alkyl trimethyl ammonium type cationic surfactants such as lauryl trimethyl ammonium chloride, n-hexadecyl trimethyl ammonium chloride, alkyl trimethyl ammonium bromide, cetyl trimethyl ammonium chloride, cetyl trimethyl ammonium bromide, stearyl trimethyl ammonium chloride, alkyl dimethyl ethyl ammonium chloride, alkyl dimethyl ethyl ammonium bromide, cetyl dimethyl ethyl ammonium bromide, dimethyl ethyl octadecyl ammonium bromide or methyldodecyl-benzyl trimethyl ammonium chloride or the like.

Moreover, the amounts of the raw materials to be used preferably range from 8 to 15 moles for water, 0.5 to 1.5 mole for an acid or an alkali for the acid or alkali hydrolysis and 0.1 to 0.4 mole for the surfactant, per mole of the organic silane. This is because if the amount of water is less than 8 moles, the resulting film does not have a sufficiently low relative dielectric constant, while if it exceeds 15 moles, solid $SiO_2$ is separated out. If the amount of the acid or alkali is less than 0.5 mole, any desired reaction never proceeds, while it exceeds 1.5 mole, the reaction system undergoes solidification. If the amount of the surfactant is less than 0.1 mole, the resulting film has a high relative dielectric constant, while if it exceeds 0.4 mole, the quality of the resulting film is impaired. In this respect, the alcohol is added to the reaction solution to adjust the overall concentration of the solution and the amount thereof to be added may vary depending on the viscosity of the reaction solution so that the resulting solution can easily be applied onto the surface of a substrate.

BEST MODE FOR CARRYING OUT THE INVENTION

According to an embodiment of the method for preparing a porous SOG film or the first invention, a porous $SiO_2$ film is prepared by preparing an organic silane solution containing an organic silane, water and an alcohol, subjecting the organic silane to acid or alkali hydrolysis to give a solution containing hydrolyzed silane, adding a surfactant to the resulting solution, applying the resulting solution onto the surface of a semiconductor substrate and then heating the coated layer in the presence of the surfactant to thus evaporate the water, the alcohol and the surfactant, and optional other organic materials if any. In this connection, as the surfactant is evaporated off, a large number of pores are formed within the film (having a void volume or voids of not less than about 60%) and thus a desired porous film can be obtained.

The raw silane is not restricted to any particular one insofar as it is an organic oxysilane capable of being decomposed, such as those listed above. The alcohol herein used is not likewise limited to any specific one inasmuch as it is an alcohol type solvent such as ethyl alcohol or isopropyl alcohol or the like. The hydrolysis carried out herein may be one with an acid or an alkali and in the hydrolysis, there may be used, as such acids or alkalis, for instance, inorganic acids such as nitric acid and hydrochloric acid; organic acids such as formic acid; alkalis such as ammonia. As the surfactant, it is preferred to use a halogenated alkyl trimethyl ammonium type cationic surfactant such as those listed above. Other surfactants usable herein may include, for instance, benzyl dimethyl decyl ammonium chloride, benzyl diethyl dodecyl ammonium chloride, trimethyl dodecyl ammonium bromide, allyl dibutyl dodecyl ammonium bromide and acetonyl diethyl dodecyl ammonium chloride or the like.

As has been described above, the amounts of the raw materials to be used preferably range from 8 to 15 moles for water, 0.5 to 1.5 mole for an acid or an alkali and 0.1 to 0.4 mole for the surfactant, respectively, per mole of the organic silane. A porous $SiO_2$ film having a desired relative dielectric constant can selectively be prepared by properly selecting the amount of the surfactant to be used and the conditions for the heat-treatment.

The organic silane solution prepared according to the foregoing method is applied onto a semiconductor substrate according to a coating method such as the currently used spin coating technique, followed by a heat-treatment using a publicly-known infrared heating furnace to thus remove the water-alcohol solvent and the surfactant as well as other organic materials through evaporation to thus form a porous $SiO_2$ film. In this respect, the conditions for the heat-treatment are not restricted to specific ones inasmuch as they permit the evaporation of, for instance, the solvent and the surfactant and the formation of the porous film. To obtain a porous film having a low relative dielectric constant, the heat-treatment is preferably carried out by first treating the coated layer at temperatures ranging from about 200 to 350° C. in the air to thus mainly evaporate the solvent and then heat-treating the same in a vacuum on the order of, for instance, 100 to $10^{-5}$ Pa and at a temperature capable of ensuring the evaporation of the surfactant and other organic materials (for instance, 250 to 500° C., preferably 350 to 450° C. and more preferably 380 to 450° C.) for a time, which is never accompanied by the destruction of the structure of the resulting porous film.

At this stage, whether the resulting porous $SiO_2$ film (SOG film) satisfies the desired requirements of the present invention or not can be confirmed by determining the relative dielectric constant of the film. The determination of the relative dielectric constant thereof can be carried out by vapor-depositing, for instance, aluminum on the porous film to form electrodes. The present invention thus permits the production of an interlayer insulating film having a low relative dielectric constant, which is seldom increased even when a film or films are laminated with or deposited on the insulating film in the semiconductor device-fabricating process subsequent to the formation of the SOG film.

As has been discussed above, the use of a preferred organic silane such as TEOS or TMOS would permit the production of an interlayer insulating film having a low relative dielectric constant, for instance, such an insulating film having a void volume of not less than 60%. As the void volume increases, for instance, if the void volume arrives at about 80%, the contribution of physical properties of the materials constituting the insulating film to the relative dielectric constant is considerably reduced and the relative dielectric constant thereof is mainly affected by the air and accordingly, the resulting interlayer insulating film has a low relative dielectric constant. From the foregoing standpoint, a hydrolyzable alkoxide may be substituted for the organic silane to prepare a porous film serving as an interlayer insulating film having a low relative dielectric constant as in the case where an organic silane is used for the production of such an interlayer insulating film. Examples of such alkoxides usable herein are alcoholates of elements belonging to the Group 4A of the Periodic Table (for instance, Ti and Zr) such as $Ti(OC_3H_7)_4$ and $Zr(OC_4H_9)_4$.

According to an embodiment of the method for the preparation of the porous SOG film of the present invention, the step for forming a porous $SiO_2$ film (the first step) is repeated at least one time in the same manner described above to thus form an additional porous $SiO_2$ film on the porous $SiO_2$ film formed in the first step. A large number of holes (void volume: not less than about 60%) are formed in the film as the surfactant is evaporated to thus form a porous film. Moreover, if the porous film is prepared in such a manner that it has a multilayered structure, the penetration of moisture into the film can effectively be inhibited and the hygroscopicity thereof can be improved. In this case, however, if the insulating film consisting of a plurality of porous films laminated together is too thick, a problem arises such that this goes against the main stream of the semiconductor-processing techniques in which the thickness of the film is gradually reduced. For this reason, it is preferred to reduce the film thickness as low as possible while taking into consideration the thickness thereof required for the reduction of the hygroscopicity to a desired level. As has been discussed above, the first step is repeated over a plurality of times, but in this case, the thickness of each porous film should be set at a level smaller than that of the porous film consisting of a single film according to the first invention. For instance, if the porous film consists of two layers, the thickness of each porous film is preferably set at a level of about 0.5 μm.

The starting silane, alcohols, acids and alkalis for hydrolysis and surfactants usable herein may be the same as those described above in connection with the foregoing first invention. Moreover, the amounts of the foregoing raw materials to be used are preferably the same as those specified above. Proper selection of the amount of the surfactant to be used and the conditions for the heat-treatment would permit the selective preparation of a multilayered porous $SiO_2$ film having a desired relative dielectric constant.

The organic silane solution prepared by the method described above is applied onto the surface of a semiconductor substrate according to a currently used coating method such as the spin coating technique and then the same s procedures for forming the porous $SiO_2$ film described above are at least once repeated to give a multilayered porous film. In this case, the conditions for the heat-treatment are the same as those described above.

The porous $SiO_2$ film thus prepared is inspected for the ability of absorbing moisture through the sides of the film according to the following procedures. The top surface and the sides of a porous $SiO_2$ film formed on a Si substrate were covered with polyimide films. The four sides of one sample out of two samples covered with polyimide films were cut off to thus expose the sections of the porous $SiO_2$ film. Tests for hygroscopicity were carried out using the coated sample and the sample whose sections of the porous $SiO_2$ film had been exposed, under the same conditions, to thus determine the dielectric constants. The relative dielectric constants were then compared with one another to thus confirm whether the film absorbed moisture through the sides thereof or not. As a result, it was found that there was not any difference in the relative dielectric constant determined after the hygroscopicity tests between the coated sample and the sample whose sections of the porous $SiO_2$ film had been exposed. This result clearly indicates that there is not any opening of the holes on the side walls of the porous $SiO_2$ film and that the holes in the porous $SiO_2$ film are arranged perpendicularly to the surface of the substrate.

Moreover, according to another embodiment of the second invention, a hydrophobic film such as a $SiO_2$ film, a $SiN_x$ film or a $SiO_xN_y$ film having a thickness of, for instance, not more than 100 nm is formed on the porous film prepared in the foregoing first step by the CVD or sputtering technique to thus cap the surface of the porous film. In this respect, if the thickness of the capping layer is too thick, the overall thickness of the resulting insulating film carrying a capping layer is also too thick and a problem thus arises such that this goes against the main stream of the semiconductor-processing techniques in which the thickness of the film is gradually reduced. For this reason, it is preferred to reduce the thickness of the capping layer as low as possible while taking into consideration the thickness thereof required for the reduction of the hygroscopicity to a desired level. In this respect, only a single capping layer may be formed or a plurality of capping layers may likewise be formed. Then the foregoing first step may if desired be repeated at least one time to further form a porous film on the capping layer or the combination of these first and capping layer-forming steps may be repeated over several times. In this case, the thickness of each porous film and that of each capping layer should be set at a level of smaller than that of the mono-layered porous film of the first invention, as in the foregoing first embodiment. For instance, if the resulting film consists of two porous films and two capping layers, the thickness of each porous film is preferably set at a level of about 0.5 $\mu$m and that of each capping layer is preferably set at a level of about 50 nm. In this way, any penetration of moisture into the porous film can be inhibited or controlled by capping the porous film with a specific hydrophobic film.

The starting silane, alcohols, acids and alkalis for hydrolysis and surfactants usable in this embodiment may be the same as those described above in connection with the first invention. Moreover, the amounts of the foregoing raw materials to be used are preferably the same as those specified above. Appropriate selection of the amount of the surfactant to be used and the conditions for the heat-treatment would permit the selective preparation of a hydrophobic porous $SiO_2$ film having a desired relative dielectric constant.

The organic silane solution prepared by the method described above is applied onto the surface of a semiconductor substrate according to a currently used coating method such as the spin coating technique and then the same procedures as described above are repeated to give a porous $SiO_2$ film. In this case, the conditions for the heat-treatment are the same as those described above.

The porous $SiO_2$ film thus prepared was inspected for the ability of absorbing moisture through the side walls of the film according to the method similar to that used above. As a result, it was found that there was not any difference in the relative dielectric constant determined after the hygroscopicity tests between the sample coated with the polyimide film and the sample whose sections of the porous $SiO_2$ film had been exposed. This result clearly indicates that there is not any opening of the holes on the side walls of the porous $SiO_2$ film and that the holes in the porous $SiO_2$ film are arranged perpendicularly to the surface of the substrate.

If the relative dielectric constant of the porous $SiO_2$ film prepared according to the second invention is determined by vapor-depositing, for instance, aluminum on the porous film to form electrodes, it would be confirmed that the resulting porous SOG film satisfies the requirements of the present invention. More specifically, the foregoing embodiment permits the formation of a porous SOG film having a low relative dielectric constant, free of any moisture-penetration into the film and having improved hygroscopicity. Furthermore, the resulting hydrophobic porous film may serve as an interlayer insulating film whose dielectric constant seldom causes any change even when another film or films are laminated with or deposited on the resulting hydrophobic porous SOG film by, for instance, the CVD technique in the semiconductor device-fabricating process.

The second invention thus permits the preparation of an interlayer insulating film having a high void volume and hence a low relative dielectric constant as in the case of the first invention, if a preferred organic silane such as TEOS or TMOS is used. In this case, it is also possible to use alkoxides similar to those used in the first invention in place of the organic silane.

In an embodiment of the method for preparing a porous SOG film according to the third invention, a porous $SiO_2$ film is prepared according to the method described above and then the unreacted OH groups remaining in the resulting porous $SiO_2$ film are removed by either the treatment with oxygen plasma, the electron beam-irradiation treatment or the UV light-irradiation treatment. A large number of holes (void volume: not less than about 50%) are formed in the resulting film as the surfactant is evaporated to thus give a porous film. Then the foregoing treatment for making the film hydrophobic (hydrophobization treatment) is applied to the porous film to thus remove the residual OH groups and the ability of the film to absorb moisture present in the atmosphere can thus be controlled. Accordingly, the third invention permits the preparation of a hydrophobic porous SOG film whose surface quality is improved.

The starting silane, alcohols, acids and alkalis for hydrolysis and surfactants usable in this embodiment may be the same as those described above in connection with the first invention. Moreover, the amounts of the foregoing raw materials to be used are preferably the same as those specified above. Appropriate selection of the amount of the surfactant to be used and the conditions for the heat-treatment (firing treatment) would permit the selective preparation of a hydrophobic porous $SiO_2$ film having a desired relative dielectric constant.

The organic silane solution prepared by the method described above is applied onto the surface of a semiconductor substrate according to a currently used coating method such as the spin coating technique and then the same procedures used above are repeated to give a porous $SiO_2$ film. In this case, the conditions for the heat-treatment are the same as those described above.

The porous $SiO_2$ film thus prepared was inspected for the ability to absorb moisture through the side walls of the film according to the method similar to that used in the second invention. As a result, it was found that there was not any difference in the relative dielectric constant determined after the hygroscopicity tests between the sample coated with the polyimide film and the sample whose sections of the porous $SiO_2$ film had been exposed. This result clearly indicates that there is not any opening of the holes on the side walls of the porous SiO$_2$ film and that the holes in the porous SiO$_2$ film are arranged perpendicularly to the surface of the substrate.

Then the foregoing porous SiO$_2$ film is made hydrophobic by subjecting the porous film to either the treatment with oxygen plasma, the electron beam-irradiation treatment or the UV light-irradiation treatment. The reaction occurred during the treatment would be accompanied by dehydration and therefore, the resulting film may in general cause cracking due to the contraction of the porous film. However, the porous film prepared by the present invention has a void volume of not less than 50% and the film structure per se may absorb any stress generated by the foregoing reaction. Consequently, there is not observed any phenomenon such as cracking at all.

The treatment for hydrophobization will hereunder be described in detail while taking the treatment with oxygen plasma (hereunder referred to as "oxygen plasma-treatment") by way of typical example.

The oxygen plasma-treatment is in general carried out in a conventional oxygen plasma-treating equipment, which makes use of the microwave discharge. More specifically, as will be seen from FIG. 1, a processing chamber 1 is provided with a substrate-holder 3 for placing a substrate 2 to be processed and the holder is equipped with a heating means 4 such as a heater. In addition, the processing chamber 1 is also provided with, on the side wall thereof, an oxygen plasma-generating equipment 8 equipped with a reactive gas-introducing zone 5 consisting of a discharge tube and a plasma-generating zone 7 connected to a microwave-generating source 6. This oxygen plasma-generating equipment 8 is designed so as to convert a reactive gas, such as oxygen gas or a gas mixture containing oxygen gas and small amounts of other gases (such as Ar, Kr and/or Xe), which is introduced into the equipment 8 from a gas source 9, into plasma by the action of the microwave-generating source 6 and to thus introduce the oxygen plasma thus formed into the processing chamber 1. The processing chamber 1 is evacuated to a vacuum with a vacuum pump 10 through an exhaust vent 11 provided on the side wall of the processing chamber, thereafter the porous SiO$_2$ film formed on the heated substrate 2 to be processed, which is placed on the substrate-holder 3, is then subject to the oxygen plasma-processing to thus remove the residual OH groups according to the foregoing reaction scheme. More specifically, the residual OH groups are converted into H$_2$O in the gaseous state, which is then exhausted through the vacuum exhaust vent 11 by the action of the vacuum pump 10. This oxygen plasma-treatment is, for instance, carried out at a flow rate of the oxygen-containing gas ranging from 100 to 2000 SCCM, an RF and microwave-generating power supply ranging from 300 to 3000 W and a pressure ranging from 0.5 to 2 Torr for a predetermined period of time.

The foregoing plasma-generating equipment is a down stream type one, but it is also possible to use other types of plasma-generating equipments such as a diode parallel plate plasma-generating equipment and an ECR (electron coupling resonance) type plasma-generating equipment. The excitation means for generating plasma is not restricted to any specific one. Moreover, other treating means other than the foregoing oxygen plasma-treatment may be used in the present invention inasmuch as they can remove the residual OH groups from the porous film. For instance, the porous film may be irradiated with electron beams using an electron beam gun or with UV light rays, according to the usual method, to thus remove the residual OH groups present on the porous film.

If the relative dielectric constant of the porous SOG film thus prepared is determined by vapor-depositing, for instance, aluminum on the film to form electrodes, it would be confirmed that the resulting hydrophobic porous SOG film satisfies the requirements of the present invention. More specifically, the foregoing method permits the formation of a porous interlayer insulating film having a low relative dielectric constant, free of any moisture-absorption. Furthermore, the resulting hydrophobic porous film seldom undergoes any change in the dielectric constant even when another film or films are laminated with or deposited on the resulting hydrophobic porous SOG film in the semiconductor device-fabricating process after the treatment for the hydrophobization.

As has been described above, the third invention thus permits the preparation of an interlayer insulating film having a high void volume and hence a low relative dielectric constant as in the case of the first invention, if a preferred organic silane such as TEOS or TMOS is used. In this case, it is also possible to use alkoxides similar to those used in the first invention in place of the organic silane.

In an embodiment of the method for preparing a porous SOG film according to the fourth invention, the foregoing heat-treatment employed when preparing a porous SiO$_2$ film is first carried out at temperatures ranging from 200 to 350° C. in the air and then at temperatures ranging from 350 to 450° C. (preferably 380 to 450° C.) in a nitrogen gas atmosphere and preferably in vacuo, after raising the temperature. If the heat-treatment is carried out in such an atmosphere, at least the inner walls of the holes present in the resulting porous film are covered with the hydrophobic groups and the relative dielectric constant of the porous film is reduced. According to this invention, a large number of holes or voids are formed (void volume: not less than about 50%) in the film as the surfactant is evaporated and thus a porous film can be obtained. In the heat-treating process for forming holes, if the hole-forming step (or porous film-forming step) is terminated while the hydrophilic groups of the surfactant are adhered to the film surface within the holes in the porous film, the hydrophobic groups of the surfactant are present in the holes and cover the inner walls of the holes in such a manner that the groups point in the direction opposite to the film surface within the holes (in other words, the hydrophobic groups direct from the film surface within the holes to the space of the holes). For this reason, at least the inner walls of the holes are hydrophobic in nature, any adsorption of moisture in the atmosphere on the porous film is thus inhibited and the resulting hydrophobic porous film is improved in the surface quality.

The starting silane, alcohols, acids and alkalis for hydrolysis and surfactants usable in this embodiment may be the same as those described above in connection with the first invention. Moreover, the amounts of the foregoing raw materials to be used are preferably the same as those specified above. Appropriate selection of the amount of the surfactant to be used and the conditions for the heat-treatment (firing treatment) would permit the selective preparation of a hydrophobic porous SiO$_2$ film having a desired relative dielectric constant.

The organic silane solution prepared by the method described above is applied onto the surface of a semiconductor substrate according to a currently used coating method such as the spin coating technique and then the same procedures used above are repeated to give a porous SiO$_2$ film. In this case, it is preferred that the conditions for the heat-treatment are the same as those described above. More specifically, a hydrophobic porous film having a low relative dielectric constant can be prepared by first heat-treating the coated layer at temperatures ranging from about 200 to 350°

C. in the air to thus mainly evaporate the water-alcohol solvent and then heat-treating the same in a gas atmosphere having a low absolute dielectric constant such as nitrogen gas atmosphere or the like and preferably in a vacuum on the order of, for instance, 100 to $10^{-5}$ Pa and at a temperature capable of ensuring the evaporation of the surfactant and other organic materials for a time, which is never accompanied by the destruction of the structure of the resulting porous film.

The porous $SiO_2$ film thus prepared was inspected for the ability of absorbing moisture through the side walls of the film according to the method similar to that used in the second invention. As a result, it was found that there was not any difference in the relative dielectric constant determined after the hygroscopicity tests between the sample coated with the polyimide film and the sample whose sections of the porous $SiO_2$ film had been exposed. This result clearly indicates that there is not any opening of the holes on the side walls of the porous $SiO_2$ film and that the holes in the porous $SiO_2$ film are arranged perpendicularly to the surface of the substrate.

If the relative dielectric constant of the hydrophobic porous SOG film prepared according to the fourth invention is determined by vapor-depositing, for instance, aluminum on the film to form electrodes, it would be confirmed that the resulting hydrophobic porous SOG film satisfies the requirements of the present invention. More specifically, the foregoing fourth invention permits the formation of a porous interlayer insulating film having a low relative dielectric constant and free of any moisture-adsorption. Furthermore, the resulting porous interlayer insulating film would seldom cause any change in the relative dielectric constant even when another film or films are laminated with or deposited on the resulting porous film in the semiconductor device-fabricating process after the preparation of the hydrophobic film.

As has been described above in detail, the fourth invention thus permits the preparation of an interlayer insulating film having a high void volume and hence a low relative dielectric constant as in the case of the first invention, if a preferred organic silane such as TEOS or TMOS is used. In this case, it is also possible to use alkoxides similar to those used in the first invention in place of the organic silane.

The foregoing porous films prepared according to the present invention were subjected to spectral analysis by the FT-IR analysis and it was confirmed that any peak ascribed to the OH group was not observed at all.

Even if unreacted hydrophilic OH groups still remain in the porous films prepared according to the foregoing first to fourth inventions, the residual OH groups can be removed by subjecting the porous films to the oxygen plasma-treatment using a currently used ashing equipment or the publicly-known electron beam-irradiation treatment using an electron beam gun or the publicly-known UV light-irradiation treatment. Therefore, the resulting porous film is further improved in the hydrophobicity.

EXAMPLES

Examples of the present invention will hereunder be described in more detail with reference to the accompanying drawings.

Example 1

The First Invention

A $SiO_2$ solution for forming a porous $SiO_2$ film (or a SOG porous film) was prepared using, as starting materials, 0.7 mole of nitric acid, 12 moles of water, 15 moles of ethanol and a predetermined amount of a surfactant per one mole of TEOS. The surfactant used herein was n-hexadecyl trimethyl ammonium chloride (available from Kanto Chemical Co., Ltd. under the trade name of CTAC1) and this was used in an amount of 0.1, 0.15, 0.2 or 0.25 mole per mole of TEOS to thus give each coating solution. Each coating solution was applied onto the surface of a semiconductor substrate (Sample Nos. A1 to H1) under the condition of 3000 rpm using a spin coater. Using a known infrared heating furnace, each substrate provided with the coated layer was first treated at temperatures ranging from 200 to 400° C. in the air and then fired at a temperature of 400° C. in an atmosphere of 100 to $10^{-5}$ Pa, as indicated in the following Table 1, to thus form each corresponding porous $SiO_2$ film. In this case, the time required for raising the temperature from the initial processing temperature of 200° C. to that used in the subsequent step of 400° C. was set at 60 minutes. In all cases, the same speed for raising temperature was used as well. This temperature-raising speed is not restricted to a particular range and it is sufficient to select the speed so as to fall within the range, which permits the formation of a film having good quality (free of any roughened surface) and which can minimize the leakage current. Moreover, the retention time of the coated layer in the vacuum firing step is not likewise limited to a particular range inasmuch as it is never accompanied by the destruction of the film structure. Therefore, the retention time of the firing step was set at 30 minutes in this Example.

Aluminum was vapor-deposited on the porous $SiO_2$ films thus prepared to form electrodes. After one week, the relative dielectric constants thereof were determined using a relative dielectric constant-measuring equipment available from HP Company (RF IMPEDANCE ANALYZER 4191A). The results thus obtained are listed in the following Table 1.

TABLE 1

| Sample No. | Initial Heat-Treatment (° C.) | Second Heat-Treatment (° C.) | Surfactant/TEOS (molar ratio) | Dielectric Const. ($\epsilon/\epsilon_0$) |
|---|---|---|---|---|
| A1 | 200 | 400 | 0.1 | 3.8 |
| B1 | 200 | 400 | 0.15 | 3.2 |
| C1 | 200 | 400 | 0.2 | 2.0 |
| D1 | 200 | 400 | 0.25 | 1.5 |
| E1 | 250 | 400 | 0.25 | 1.5 |
| F1 | 300 | 400 | 0.25 | 2.5 |
| G1 | 350 | 400 | 0.25 | 3.2 |
| H1 | 400 | 400 | 0.25 | 4.1 |

The data shown in Table 1 clearly indicate that if the coated layer is first treated at temperatures ranging from 200 to 350° C. in the air and then treated at 400° C. in a vacuum, the resulting SOG film has a low relative dielectric constant falling within the range of from 1.0 to 4.0. Moreover, the resulting SOG film seldom underwent any change in the relative dielectric constant even when another film or films were further deposited on or laminated with the SOG film by, for instance, the CVD technique in the semiconductor device-fabricating process.

Figure 2:
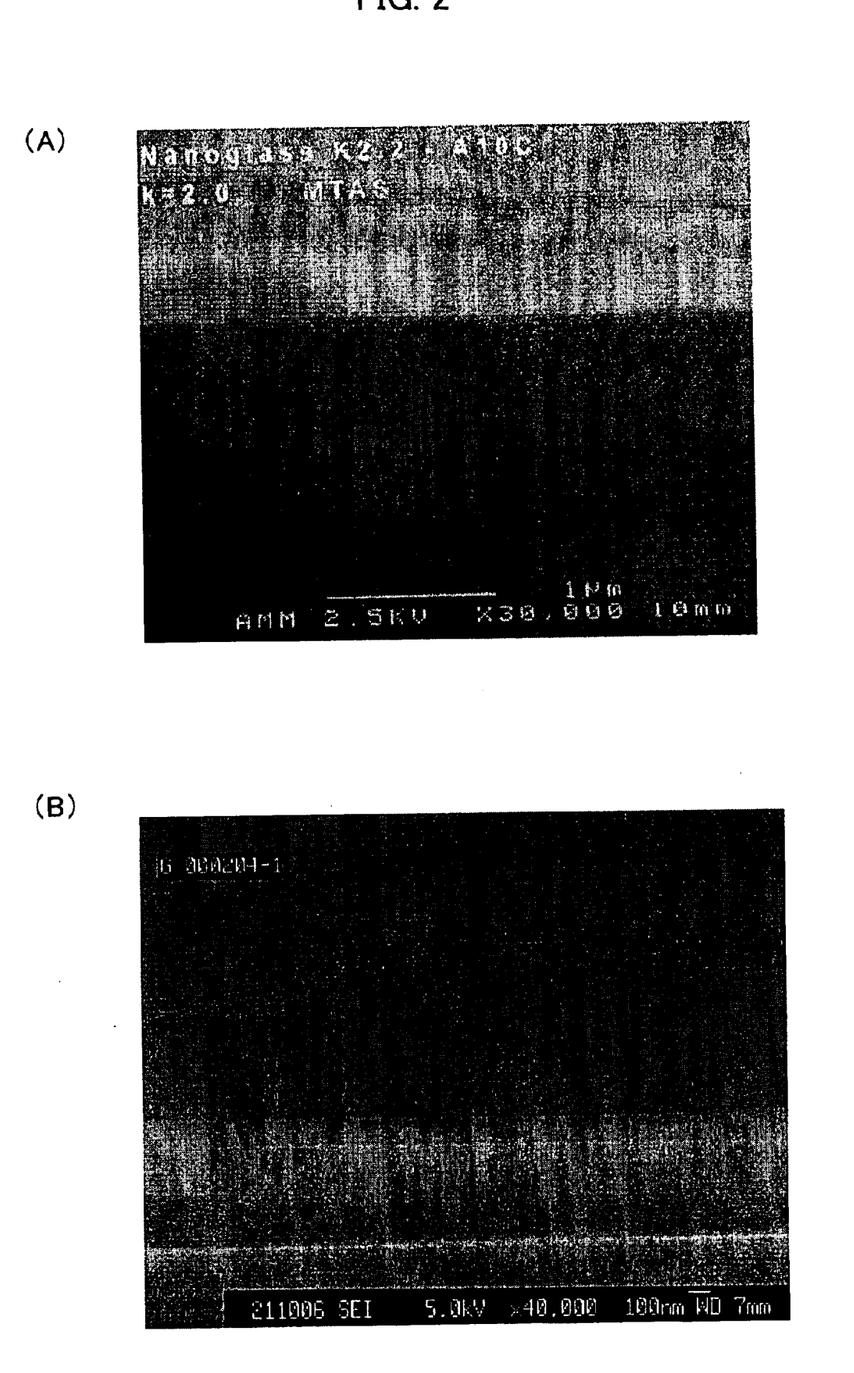
FIG. 2(A) is a scanning electron micrograph (SEM) illustrating the cross section of a porous $SiO_2$ film prepared by a conventional method.
FIG. 2(B) is a scanning electron micrograph (SEM) illustrating the cross section of a porous $SiO_2$ film prepared by the method of the present invention.

The qualities of the porous SOG film prepared according to the foregoing Example and a porous $SiO_2$ film also formed on a substrate by a conventional method (a method making use of the silylation of an inorganic SOG) were observed by taking micrographs (FIG. 2) of the cross sections thereof using a scanning electron microscope (SEM). These SEM images indicate that there are observed holes having a large diameter (ranging from several nanometers to several tens of nanometers) in the conventional film (FIG. 2(A)), while the SOG film of the present invention includes extremely small holes and that the holes are indeed ones having a diameter of not more than 1 nm (FIG. 2(B)), which cannot be observed with the SEM.

Alternatively, the same results discussed above were obtained when lauryl trimethyl ammonium chloride (trade name: Coatamine 24P, available from Kao Corporation) as a surfactant was substituted for the n-hexadecyl tritmethyl ammonium chloride used above.

Example 2

The Second Invention

An insulating film (Sample Nos. A2 to H2) consisting of a bilayer porous film was prepared by forming a porous film (thickness: 0.5 μm) according to the film-forming steps used in Example 1 and then forming a porous $SiO_2$ film (thickness: 0.5 μm) similar to the foregoing porous film on the surface of the foregoing porous film by repeating the film-forming steps.

Aluminum was vapor-deposited on the multilayered porous $SiO_2$ films thus prepared to form electrodes. After one week, the relative dielectric constants thereof were determined using a relative dielectric constant-measuring equipment available from HP Company (RF IMPEDANCE ANALYZER 4191A). The results thus obtained are listed in the following Table 2.

TABLE 2

| Sample No. | Initial Heat-Treatment (° C.) | Second Heat-Treatment (° C.) | Surfactant/TEOS (molar ratio) | Dielectric Const. ($\epsilon/\epsilon_0$) |
|---|---|---|---|---|
| A2 | 200 | 400 | 0.1 | 2.9 |
| B2 | 200 | 400 | 0.15 | 2.5 |
| C2 | 200 | 400 | 0.2 | 1.9 |
| D2 | 200 | 400 | 0.25 | 1.5 |
| E2 | 250 | 400 | 0.25 | 1.8 |
| F2 | 300 | 400 | 0.25 | 2.3 |
| G2 | 350 | 400 | 0.25 | 2.8 |
| H2 | 400 | 400 | 0.25 | 3.4 |

The data shown in Table 2 clearly indicate that if the coated layer is first treated at temperatures ranging from 200 to 350° C. in the air and then treated at 400° C. in a vacuum, the resulting SOG film has a low relative dielectric constant falling within the range of from 1.5 to 2.9. Moreover, the resulting SOG film seldom underwent any change in the relative dielectric constant even when another film or films were further deposited on or laminated with the SOG film by, for instance, the CVD technique in the semiconductor device-fabricating process. Moreover, the resulting SOG film did not suffer from any problem of strength and was rather improved in the strength as compared with the monolayer film when these films had the same thickness.

The qualities of a monolayer of the porous SOG film prepared on a substrate according to the foregoing Example and a porous $SiO_2$ film likewise formed on a substrate by a conventional method (a method making use of the silylation of an inorganic SOG) were observed by taking micrographs of the cross sections thereof using a scanning electron microscope (SEM). These SEM images indicate that there are observed holes having a large diameter (ranging from several nanometers to several tens of nanometers) in the conventional film, while the SOG film of the present invention includes extremely small holes and that the holes are indeed ones having a diameter of not more than 1 nm, which cannot be observed with the SEM. In this Example, only the monolayered film was examined by the SEM, but it is a matter of course that a multilayered film would have the same tendency.

Alternatively, the same results discussed above were obtained when lauryl trimethyl ammonium chloride (trade name: Coatamine 24P, available from Kao Corporation) as a surfactant was substituted for the n-hexadecyl trimethyl ammonium chloride used above.

Example 3

The Second Invention

A $SiO_2$ film, a $SiN_x$ film or a $SiO_xN_y$ film (thickness: 50 nm) was formed on the surface of the porous $SiO_2$ film (thickness: 0.5 μm) obtained in the first step of Example 2 by the CVD or sputtering method to thus cap the surface of the porous film. Then the foregoing first step and the capping layer-forming step were repeated under the same conditions to thus form, in order, a porous film and a capping layer on the first capping layer.

Aluminum electrodes were vapor-deposited on the multilayered porous films thus prepared and thereafter the relative dielectric constants thereof were determined using a relative dielectric constant-measuring equipment available from HP Company (RF IMPEDANCE ANALYZER 4191A). As a result, it was found that values similar to those listed in Table 2 were obtained. Accordingly, such a multilayered porous film may be used as useful interlayer insulating film.

Example 4

The Second Invention

A $SiO_2$ film, a $SiN_x$ film or a $SiO_xN_y$ film (thickness: 50 nm) was formed on the surface of the porous $SiO_2$ films (thickness: 0.5 μm) obtained in the first step of Example 1 by the CVD) or sputtering method to thus cap the surface of the porous film (Sample Nos. A3 to H3).

Aluminum electrodes were vapor-deposited on the hydrophobic porous $SiO_2$ films thus prepared and thereafter the relative dielectric constants thereof were determined after one week using a relative dielectric constant-measuring equipment available from HP Company (RF IMPEDANCE ANALYZER 4191A). The relative dielectric constants thus obtained are listed in the following Table 3.

TABLE 3

| Sample No. | Initial Heat-Treatment (° C.) | Second Heat-Treatment (° C.) | Surfactant/TEOS (molar ratio) | Dielectric Const. A ($\epsilon/\epsilon_0$) | Dielectric Const. B ($\epsilon/\epsilon_0$) |
|---|---|---|---|---|---|
| A3 | 200 | 400 | 0.1 | 3.8 | 4.0 |
| B3 | 200 | 400 | 0.15 | 3.2 | 3.4 |
| C3 | 200 | 400 | 0.2 | 2.0 | 2.3 |
| D3 | 200 | 400 | 0.25 | 1.5 | 1.7 |
| E3 | 250 | 400 | 0.25 | 1.5 | 1.8 |
| F3 | 300 | 400 | 0.25 | 2.5 | 2.7 |
| G3 | 350 | 400 | 0.25 | 3.2 | 3.4 |
| H3 | 400 | 400 | 0.25 | 4.1 | 4.4 |

In Table 3, the dielectric constant A is the relative dielectric constant of a sample of the porous film on which aluminum electrodes were vapor-deposited after forming the porous film, without capping the surface thereof with a hydrophobic film, and it is determined after allowing the sample to stand in a room over one week On the other hand, the dielectric constant B is the relative dielectric constant of a sample of the hydrophobic porous film on which aluminum electrodes were vapor-deposited after forming the porous film and capping the surface thereof with a hydrophobic film and it is determined after allowing the sample to stand in a room over one week.

As will be seen from the data listed in Table 3, if the coated layer is treated at temperatures ranging from 200 to 350° C. in the air and then treated at 400° C. in a vacuum, an SOG film having a low relative dielectric constant A ranging from 1.0 to 4.0 can be obtained and the dielectric constant B seldom causes any change. Moreover, it was also found that the resulting hydrophobic porous SOG film seldom caused any change in the relative dielectric constant even when another film or films were further deposited on or laminated with the SOG film by, for instance, the CVD technique in the semiconductor device-fabricating process.

The qualities of a porous SOG film prepared on a substrate according to the procedures used in the foregoing Example and a porous $SiO_2$ film likewise formed on a substrate by a conventional method (a method making use of the silylation of an inorganic SOG) were observed by taking micrographs of the cross sections thereof using a scanning electron microscope (SEM). As a result, results obtained are almost identical to those obtained in Example 1. More specifically, these SEM images indicate that there are observed holes having a large diameter (ranging from several nanometers to several tens of nanometers) in the conventional film, while the SOG film of the present invention includes extremely small holes and that the holes are indeed ones having a diameter of not more than 1 nm, which cannot be observed with the SEM.

Alternatively, the same results discussed above were obtained when lauryl trimethyl ammonium chloride (trade name: Coatamine 24P, available from Kao Corporation) as a surfactant was substituted for the n-hexadecyl trimethyl ammonium chloride used above.

Example 5

The Third Invention

Figure 1:
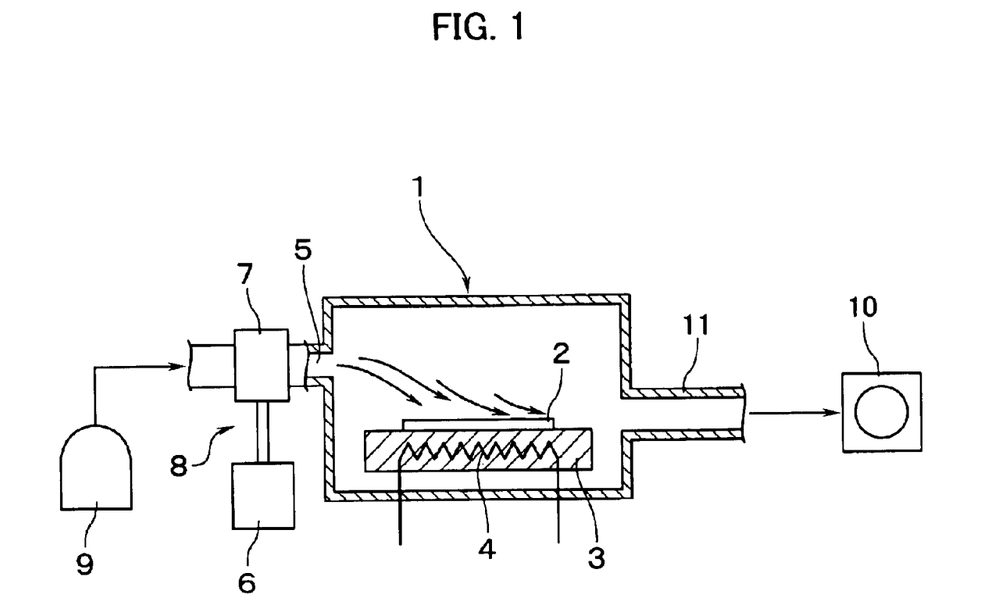
FIG. 1 is a schematic cross sectional view showing the processing chamber used for the treatment with oxygen plasma according to the present invention.

Porous $SiO_2$ films (Sample Nos. A4 to H4, thickness: 0.7 μm, void volume: 80%) prepared according to the film-forming method described in Example 1 were treated in an oxygen plasma-processing equipment, while making use of the usual microwave discharge. More specifically, a substrate 2 to be processed on which a porous film had been formed was placed on a substrate-holder 3 provided in an oxygen plasma-processing chamber 1 as shown in FIG. 1 and the substrate was simultaneously heated by a heater 4 (at 100° C. On the other hand, 100 SCCM of oxygen gas was introduced into an oxygen plasma-generating equipment 8 set up on the side wall of the chamber 1 through a gas source 9 connected to a reactive gas-introducing zone 5 constituted by a discharge tube, followed by switching on a microwave power source 6 (2.45 GHz) connected to a plasma-generating zone 7 to thus convert the oxygen gas into plasma. The plasma thus generated was introduced into the processing chamber 1 and over the substrate 2 and this plasma processing step was continued for about 1 to 5 minutes. The pressure in the processing chamber was adjusted to 0.1 Torr. The water formed through the reaction was evaporated and exhausted by a vacuum pump 10 through a vacuum exhaust port 11.

Figure 3:
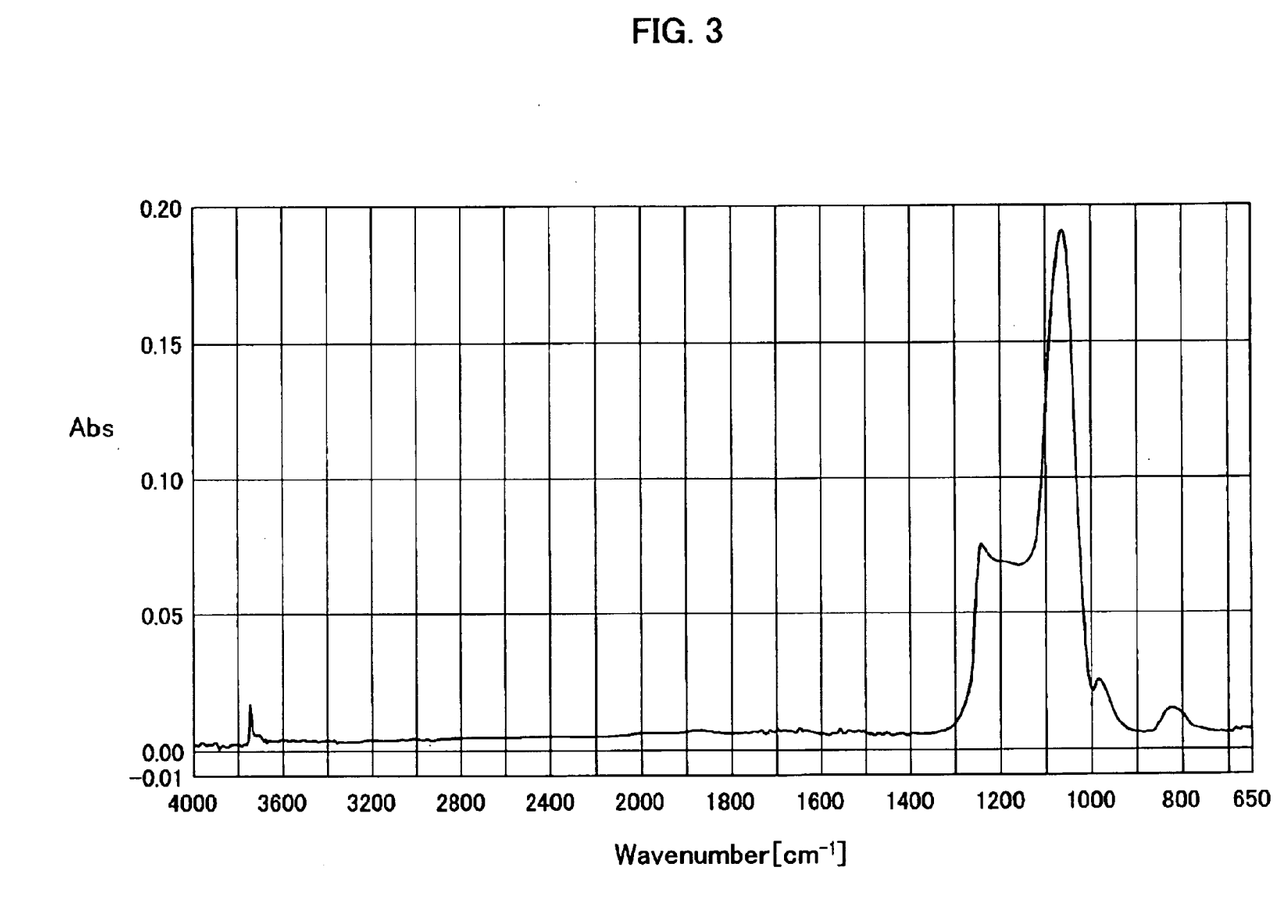
FIG. 3 is an FT-IR spectral chart observed for the porous film prepared according to the present invention.

The porous film subjected to the foregoing oxygen plasma-processing was spectrometrically examined by the FT-IR analysis (FIG. 3). The results shown in FIG. 3 indicate that the oxygen plasma-processed porous film obtained in this Example does not have any peak near 3400 $cm^{-1}$ ascribed to the OH group, unlike the porous film free of any oxygen plasma-treatment and thus the residual OH groups are removed from the film.

Aluminum electrodes were vapor-deposited on the hydrophobic porous $SiO_2$ films thus prepared and control porous $SiO_2$ films and thereafter the relative dielectric constants thereof were determined using a relative dielectric constant-measuring equipment available from HP Company (RF IMPEDANCE ANALYZER 4191A). The relative dielectric constants thus obtained are listed in the following Table 4.

In Table 4, the dielectric constant A is the relative dielectric constant of a control sample of the porous film on which aluminum electrodes were vapor-deposited after forming the porous film, without subjecting the film to any oxygen plasma-treatment, and it is determined after allowing the sample to stand in a room over one week. On the other hand, the dielectric constant B is the relative dielectric constant of a sample of a hydrophobic porous film on which aluminum electrodes were vapor-deposited after forming the porous film and then subjecting it to an oxygen plasma-treatment and it is determined after allowing the sample to stand in a room over one week.

TABLE 4

| Sample No. | Initial Heat-Treatment (° C.) | Second Heat-Treatment (° C.) | Surfactant/ TEOS (molar ratio) | Dielectric Const. A ($\epsilon/\epsilon_0$) | Dielectric Const. B ($\epsilon/\epsilon_0$) |
|---|---|---|---|---|---|
| A4 | 200 | 400 | 0.1 | 8.2 | 3.8 |
| B4 | 200 | 400 | 0.15 | 8.5 | 3.2 |
| C4 | 200 | 400 | 0.2 | 7.6 | 2.0 |
| D4 | 200 | 400 | 0.25 | 7.5 | 1.5 |
| E4 | 250 | 400 | 0.25 | 7.2 | 1.5 |
| F4 | 300 | 400 | 0.25 | 8.1 | 2.5 |
| G4 | 350 | 400 | 0.25 | 8.3 | 3.2 |
| H4 | 400 | 400 | 0.25 | 10.2 | 4.1 |

As will be seen from the data listed in Table 4, if a film first treated at 200 to 350° C. in the air and then at 400° C. in a vacuum is allowed to stand in a room over one week, the relative dielectric constant (dielectric constant A) thereof is increased to a higher level on the order of 7.2 to 8.5. On the other hand, the hydrophobic porous film obtained after the oxygen plasma-treatment still has a low relative dielectric constant (dielectric constant B) on the order of 1.5 to 3.8 even after allowing it to stand in a room over one week. The fact that the dielectric constant B is lower than the dielectric constant A means that the residual OH groups are removed and that the resulting porous film does not have any ability to adsorb moisture. For this reason, the resulting porous film does not suffer from a problem of the corrosion of interconnections of, for instance, Al. Moreover, the hydrophobic porous SOG film subjected to the oxygen plasma-treatment seldom caused any increase of the relative dielectric constant even when another film or films were deposited on or laminated with the porous film by, for instance, the CVD technique in the semiconductor device-fabricating process.

The qualities of a porous SOG film prepared on a substrate according to the procedures used in the foregoing Example and a porous $SiO_2$ film likewise formed on a substrate by a conventional method (a method making use of the silylation of an inorganic SOG) were observed by taking micrographs of the cross sections thereof using a scanning electron microscope (SEM). As a result, results obtained are almost identical to those obtained in Example 1. More specifically, these SEM images indicate that there are observed holes having a large diameter (ranging from several nanometers to several tens of nanometers) in the conventional film, while the SOG film of the present invention includes extremely small holes and that the holes are indeed ones having a diameter of not more than 1 m, which cannot be observed with the SEM.

Alternatively, the same results discussed above were obtained when lauryl trimethyl ammonium chloride (trade name: Coatamine 24P, available from Kao Corporation) as a surfactant was substituted for the n-hexadecyl trimethyl ammonium chloride used above.

Example 6

The Fourth Invention

A $SiO_2$ solution for forming a porous SOG film (or a porous $SiO_2$ film) was prepared using, as starting materials, 0.7 mole of nitric acid, 12 moles of water, 15 moles of ethanol and a predetermined amount of a surfactant per one mole of TEOS. The surfactant used herein was n-hexadecyl trimethyl ammonium chloride (available from Kanto Chemical Co., Ltd. under the trade name of CTAC1) and this was used in an amount of 0.1, 0.15, 0.2 or 0.25 mole per mole of TEOS to thus give each coating solution. Each coating solution was applied onto the surface of a semiconductor substrate under the condition of 3000 rpm using a spin coater. Using a known infrared heating furnace, each substrate provided with the coated layer was subjected to the first heat-treatment at temperatures ranging from 200 to 400° C. in the air and then to the second heat-treatment at a temperature of 400° C. in an atmosphere of 100 to $10^{-5}$ Pa, as indicated in the following Table 5 to thus form each corresponding hydrophobic porous $SiO_2$ film (Sample Nos. A5 to H5). In addition, hydrophobic porous $SiO_2$ films were likewise prepared by repeating the foregoing procedures except for carrying out the second heat-treatment (firing step) at 350, 400, 450 and 500° C. in an atmosphere of 100 to $10^{-5}$ Pa subsequent to the foregoing first heat-treatment as shown in Table 6 (Sample Nos. I5 to L5).

In this case, the time required for raising the temperature from the initial processing (first heat-treating) temperature of 200° C. to that used in the subsequent step (second heat-treatment step) of 400° C. was set at 60 minutes. In other cases, the same speed for raising temperature was used as well. This temperature-raising speed is not restricted to a particular range and it is sufficient to select the speed so as to fall within the range, which permits the formation of a film having good quality (free of any roughened surface) and which can minimize the leakage current. Moreover, the retention time of the coated layer in the vacuum firing step is not likewise limited to a particular range inasmuch as it is never accompanied by the destruction of the film structure. Therefore, the retention time of the firing step was set at 30 minutes in this Example.

The porous films thus prepared were spectrometrically examined by the FT-IR analysis. The porous film obtained in this Example does not have any peak near 3400 $cm^{-1}$ ascribed to the OH group, like the results shown in FIG. 3.

The hydrophobic porous $SiO_2$ films thus prepared (Sample Nos. A5 to L5) were inspected for the relative dielectric constants by vapor-depositing aluminum on the film to form electrodes. After one week, the relative dielectric constants of the films on which the electrodes were formed were determined by using a relative dielectric constant-measuring equipment available from HP Company (RF IMPEDANCE ANALYZER 4191A). The results thus obtained are listed in the following Tables 5 and 6.

TABLE 5

| Sample No. | Initial Heat-Treatment (° C.) | Second Heat-Treatment (° C.) | Surfactant/TEOS (molar ratio) | Dielectric Const. ($\epsilon/\epsilon_0$) |
|---|---|---|---|---|
| A5 | 200 | 400 | 0.1 | 3.8 |
| B5 | 200 | 400 | 0.15 | 3.2 |
| C5 | 200 | 400 | 0.2 | 2.0 |
| D5 | 200 | 400 | 0.25 | 1.5 |
| E5 | 250 | 400 | 0.25 | 1.5 |
| F5 | 300 | 400 | 0.25 | 2.5 |
| G5 | 350 | 400 | 0.25 | 3.2 |
| H5 | 400 | 400 | 0.25 | 4.1 |

The data shown in Table 5 clearly indicate that if the coated layer is first treated at temperatures ranging from 200 to 350° C. in the air and then treated at 400° C. in a vacuum, the resulting SOG film has a low relative dielectric constant falling within the range of from 1.0 to 4.0. Moreover, the resulting SOG film seldom underwent any change in the relative dielectric constant even when another film or films were further deposited on or laminated with the SOG film by, for instance, the CVD technique in the semiconductor device-fabricating process.

TABLE 6

| Sample No. | Initial Heat-Treatment (° C.) | Second Heat-Treatment (° C.) | Surfactant/TEOS (molar ratio) | Dielectric Const. ($\epsilon/\epsilon_0$) |
|---|---|---|---|---|
| I5 | 200 | 350 | 0.25 | 2.8 |
| J5 | 250 | 400 | 0.25 | 1.7 |
| K5 | 300 | 450 | 0.25 | 2.2 |
| L5 | 350 | 500 | 0.25 | 3.0 |

The data shown in Table 6 clearly indicate that if the coated layer is first treated at temperatures ranging from 200 to 350° C. in the air and then treated at temperatures ranging from 350 to 450° C. in a vacuum, the resulting SOG film has a low relative dielectric constant on the order of not more than 4.0.

The FT-IR spectrometrical analysis indicates that there is not observed any peak ascribed to the OH group. This indicates that there is not observed any moisture adsorption due to the presence of OH groups and that the resulting porous film never causes any corrosion of interconnections such as those formed from Al. Moreover, the hydrophobic porous SOG film obtained in this Example seldom caused any change of the relative dielectric constant even when another film or films were deposited on or laminated with the porous film by, for instance, the CVD technique in the semiconductor device-fabricating process.

The qualities of the porous SOG film (Sample No. J5) prepared on a substrate according to the procedures of this Example and a porous $SiO_2$ film likewise formed on a substrate by a conventional method (a method making use of the silylation of an inorganic SOG) were observed by taking micrographs of the cross sections thereof using a scanning electron microscope (SEM). The results thus obtained were almost identical to those obtained in Example 1. More specifically, these SEM images indicate that there are observed holes having a large diameter (ranging from several nanometers to several tens of nanometers) in the conventional film, while the SOG film prepared in this Example includes extremely small holes and that the holes are indeed ones having a diameter of not more than 1 nm, which cannot be observed with the SEM.

Alternatively, the same results discussed above were obtained when lauryl trimethyl ammonium chloride (trade name: Coatamine 24P, available from Kao Corporation) as a surfactant was substituted for the n-hexadecyl trimethyl ammonium chloride used above.

Industrial Applicability

As has been discussed above in detail, the method for the preparation of a porous SOG film according to the present invention is quite useful for forming an interlayer insulating film in the field of the process for fabricating a semiconductor device such as LSI.

What is claimed is:

1. A method for preparing a porous SOG film comprising the steps of preparing a solution containing an organic silane, water and an alcohol, subjecting said organic silane to acid hydrolysis or alkali hydrolysis and then heat-treating a resulting reaction system in the presence of a surfactant to thus form a porous $SiO_2$ film having a void volume of not less than 50%.

2. The method for preparing a porous SOG film as set forth in claim 1 wherein said method further comprises the step of repeating, at least one time, said steps for preparing said porous $SiO_2$ film having a void volume of not less than 50% to thus form, in order, an additional porous $SiO_2$ film, which has a void volume of not less than 50%, on said porous $SiO_2$ film, whereby said porous films constituting a laminate are put in layers while holes present in every neighboring porous films and arranged perpendicularly to a substrate deviate from one another and therefore said holes present in an uppermost film have almost no communication with those present in a lowermost film.

3. The method for preparing a porous SOG film as set forth in claim 2 wherein said method further comprises a capping step in which either of a $SiO_2$ film, a $SiN_x$ film and a $SiO_xN_y$ film is formed on said porous $SiO_2$ film by a CVD or sputtering method to thus cap the surface of said porous film and a step of repeating said porous $SiO_2$ film-forming and capping steps at least one time to form a multilayered film.

4. The method for preparing a porous SOG film as set forth in claim 1 wherein after forming said porous $SiO_2$ film, either of a $SiO_2$ film, a $SiN_x$ film and a $SiO_xN_y$ film is formed on the surface of said porous $SiO_2$ film by a CVD or sputtering method to thus cap the surface of said porous film and to thus form a porous $SiO_2$ film.

5. The method for preparing a porous SOG film as set forth in claim 1 wherein after forming said porous $SiO_2$ film, unreacted OH groups remaining in said $SiO_2$ porous film are removed by subjecting said porous $SiO_2$ film to either of an oxygen plasma-treatment, an electron beam-irradiation and a UV light-irradiation treatment to thus form a porous $SiO_2$ film having a void volume of not less than 50%.

6. The method for preparing a porous SOG film as set forth in claim 1 wherein said heat-treatment comprises a first heat-treating step carried out at a temperature sufficient for mainly evaporating said water and alcohol present in a reaction system and a second heat-treating step carried out at a temperature sufficient for covering at least inner walls of holes present in a resulting porous $SiO_2$ film with hydrophobic moieties of surfactant and having a void volume of not less than 50%, said temperature used in said second step being higher than that used in said first step.

7. The method for preparing a porous SOG film as set forth in claim 6 wherein said second heat-treating step is carried out at temperatures ranging from 350 to 450° C.

8. A method for preparing a porous SOG film comprising the steps of mixing an organic silane, water, an alcohol and an acid or an alkali, adding a surfactant to a mixture thereof to prepare an organic silane solution, spin-coating said organic silane solution on a semiconductor substrate to obtain a coated layer and then heat-treating said coated layer to evaporate said water, alcohol and surfactant and to thus form a porous $SiO_2$ film having a void volume of not less than 50%.

9. The method for preparing a porous SOG film as set forth in claim 8 wherein said method further comprises the steps of forming either of a $SiO_2$ film, a $SiN_x$ film and a $SiO_xN_y$ film on the surface of said porous $SiO_2$ film obtained after said heat-treatment by a CVD or sputtering method to thus cap the surface of said porous film and then repeating said heat-treating and capping steps at least one time to form a multilayered film.

10. The method for preparing a porous SOG film as set forth in claim 8 wherein after forming said porous $SiO_2$ film, either of a $SiO_2$ film, a $SiN_x$ film or a $SiO_xN_y$ film is formed on the surface of said porous $SiO_2$ film by a CVD or sputtering method to thus cap the surface of said porous film and to thus form a porous $SiO_2$ film.

11. The method for preparing a porous SOG film as set forth in claim 8 wherein after forming said porous $SiO_2$ film, unreacted OH groups remaining in said porous film are removed by subjecting said porous film to either of an oxygen plasma-treatment, an electron beam-irradiation and a UV light-irradiation treatment to thus form a porous $SiO_2$ film having a void volume of not less than 50%.

12. The method for preparing a porous SOG film as set forth in claim 8 wherein said heat-treatment is carried out in two stages: in a first stage, said porous film is treated at temperatures ranging from 200 to 350° C. to thus mainly evaporate said water and alcohol and in a second stage, said porous film is treated at temperatures ranging from 350 to 450° C. to thus finish formation of said porous film, while adhering hydrophilic moieties of surfactant to at least an inner surface of holes present in a resulting porous film and to thus cover inner walls of said holes with hydrophobic moieties of said surfactant, to thus form a porous $SiO_2$ film having a void volume of not less than 50%.

13. The method for preparing a porous SOG film as set forth in any of claims 1 to 12 wherein said organic silane is a hydrolyzable organic oxysilane and said surfactant is a cationic surfactant.

14. The method for preparing a porous SOG film as set forth in any of claims 1 to 12 wherein said organic silane is tetraethoxy silane or tetramethoxy silane and said surfactant is a halogenated alkyl trimethyl ammonium type cationic surfactant such as lauryl trimethyl ammonium chloride, n-hexadecyl trimethyl ammonium chloride, alkyl trimethyl ammonium bromide, cetyl trimethyl ammonium chloride, cetyl trimethyl ammonium bromide, stearyl trimethyl ammonium chloride, alkyl dimethyl ethyl ammonium chloride, alkyl dimethyl ethyl ammonium bromide, cetyl dimethyl ethyl ammonium bromide, dimethyl ethyl octadecyl ammonium bromide or methyldodecyl benzyl trimethyl ammonium chloride.

15. The method for preparing a porous SOG film as set forth in any of claims 1 to 12 wherein said water, acid or alkali and surfactant are used in amounts ranging from 8 to 15 moles, 0.5 to 1.5 mole and 0.1 to 0.4 mole, respectively, per one mole of said organic silane.

\* \* \* \* \*